(12) United States Patent
Lee (10) Patent No.: US 11,342,612 B2
(45) Date of Patent: *May 24, 2022

(54) BATTERY MODULE WITH IMPROVED HEAT DISSIPATION, BATTERY PACK INCLUDING THE BATTERY MODULE AND VEHICLE INCLUDING THE BATTERY PACK

(71) Applicant: LG ENERGY SOLUTION, LTD., Seoul (KR)

(72) Inventor: Han-Young Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 26 days.

This patent is subject to a terminal disclaimer.

(21) Appl. No.: 17/048,450

(22) PCT Filed: Nov. 4, 2019

(86) PCT No.: PCT/KR2019/014841
§ 371 (c)(1),
(2) Date: Oct. 16, 2020

(87) PCT Pub. No.: WO2020/111550
PCT Pub. Date: Jun. 4, 2020

(65) Prior Publication Data
US 2021/0167446 A1 Jun. 3, 2021

(30) Foreign Application Priority Data
Nov. 29, 2018 (KR) .................. 10-2018-0151275

(51) Int. Cl.
*H01M 10/6572* (2014.01)
*H01M 50/533* (2021.01)
(Continued)

(52) U.S. Cl.
CPC .... *H01M 10/6572* (2015.04); *G01R 31/3835* (2019.01); *H01M 10/625* (2015.04); *H01M 10/647* (2015.04); *H01M 50/533* (2021.01)

(58) Field of Classification Search
None
See application file for complete search history.

(56) References Cited

U.S. PATENT DOCUMENTS

2005/0029990 A1* 2/2005 Tsukamoto ........... H01M 10/44
320/135
2006/0038534 A1 2/2006 Chang et al.
(Continued)

FOREIGN PATENT DOCUMENTS

DE 10 2013 018 474 A1 5/2015
EP 2 418 716 A1 2/2012
(Continued)

OTHER PUBLICATIONS

Extended European Search Report for corresponding European Application No. 19889489.1, dated Jul. 30, 2021.
(Continued)

*Primary Examiner* — Amanda J Barrow
(74) *Attorney, Agent, or Firm* — Birch, Stewart, Kolasch & Birch, LLP (57) ABSTRACT

A battery module improves heat dissipation by causing electronic cooling to occur at a specific voltage or higher, a battery pack including the battery module and a vehicle including the battery pack. The battery module including a plurality of battery cells and lead junction parts in which respective leads of the battery cells are joined to each other includes a thermoelectric device mounted onto the lead junction part; and a constant voltage device configured to divert a current of the battery module to the thermoelectric device when an overcharge of the battery module occurs, and wherein the thermoelectric device is driven to electroni-
(Continued)

cally cool the lead junction part of the battery module when the overcharge of the battery module occurs.

10 Claims, 7 Drawing Sheets

(51) Int. Cl.
  *G01R 31/3835* (2019.01)
  *H01M 10/625* (2014.01)
  *H01M 10/647* (2014.01)

(56) References Cited

U.S. PATENT DOCUMENTS

| | | | | |
|---|---|---|---|---|
| 2006/0110657 | A1* | 5/2006 | Stanton | H01M 10/121 |
| | | | | 429/120 |
| 2009/0179618 | A1* | 7/2009 | LiTingTun | H01M 10/44 |
| | | | | 320/136 |
| 2011/0048485 | A1* | 3/2011 | Goff | H01M 50/20 |
| | | | | 136/203 |
| 2011/0070474 | A1 | 3/2011 | Lee et al. | |
| 2011/0287285 | A1* | 11/2011 | Yoon | B60L 58/27 |
| | | | | 429/9 |
| 2015/0229011 | A1* | 8/2015 | Gless | B60L 58/26 |
| | | | | 62/3.2 |
| 2015/0372356 | A1* | 12/2015 | Kossakovski | H01M 10/633 |
| | | | | 136/201 |
| 2017/0187371 | A1* | 6/2017 | Fabregas | H02H 9/02 |
| 2017/0256833 | A1* | 9/2017 | Ciaccio | H01G 11/18 |
| 2018/0047518 | A1* | 2/2018 | Kuboki | H01G 11/12 |
| 2019/0103640 | A1* | 4/2019 | Takabayashi | H01M 10/647 |
| 2021/0257693 | A1* | 8/2021 | Lee | H01M 10/6572 |

FOREIGN PATENT DOCUMENTS

| | | |
|---|---|---|
| EP | 3 525 314 A1 | 8/2019 |
| JP | 8-83630 A | 3/1996 |
| JP | 2005-116442 A | 4/2005 |
| JP | 2008-10295 A | 1/2008 |
| JP | 2012-523085 A | 9/2012 |
| KR | 10-2006-0050510 A | 5/2006 |
| KR | 10-2011-0015070 A | 2/2011 |
| KR | 10-1382663 B1 | 4/2014 |
| KR | 10-1419556 B1 | 7/2014 |
| KR | 10-2016-0006000 A | 1/2016 |
| KR | 10-2016-0041257 A | 4/2016 |
| KR | 10-2016-0131627 A | 11/2016 |
| KR | 10-2016-0006000 * 5/2017 | ........ H01M 10/6572 |
| KR | 10-2018-0022250 A | 3/2018 |
| KR | 10-2018-0116707 A | 10/2018 |
| WO | WO 2016/020999 A1 | 2/2016 |

OTHER PUBLICATIONS

International Search Report (PCT/ISA/210) issued in PCT/KR2019/014841, dated Feb. 21, 2020.

* cited by examiner

BATTERY MODULE WITH IMPROVED HEAT DISSIPATION, BATTERY PACK INCLUDING THE BATTERY MODULE AND VEHICLE INCLUDING THE BATTERY PACK

TECHNICAL FIELD

The present disclosure relates to a battery module, and more particularly to a battery module that improves heat dissipation by causing electronic cooling to occur at a specific voltage or higher. The present disclosure also relates to a battery pack including the battery module and a vehicle including the battery pack. The present application claims priority to Korean Patent Application No. 10-2008-0151275 filed on Nov. 29, 2018 in the Republic of Korea, the disclosures of which are incorporated herein by reference.

BACKGROUND ART

Currently commercialized secondary batteries include nickel cadmium batteries, nickel hydrogen batteries, nickel zinc batteries, lithium secondary batteries, and the like. Among these secondary batteries, because lithium secondary batteries have almost no memory effect compared to nickel-based secondary batteries, lithium secondary batteries are in the spotlight owing to the advantages of free charge and discharge, very low self discharge rate, and high energy density.

Such a lithium secondary battery mainly uses lithium-based oxides and carbon materials as positive electrode active materials and negative electrode active materials, respectively. The lithium secondary battery includes an electrode assembly that assembles a unit cell having a structure in which a positive electrode plate having a positive electrode active material coated on a positive electrode current collector and a negative electrode plate having a negative electrode active material coated on a negative electrode current collector are arranged with a separator interposed therebetween, and a sheath material, that is, a battery case, that seals and accommodates the assembly together with an electrolyte solution. According to the shape of the battery case, lithium secondary batteries are classified into can type secondary batteries in which the electrode assembly is embedded in a metal can and pouch type secondary batteries in which the electrode assembly is embedded in an aluminum laminated sheet pouch.

Recently, secondary batteries are widely used not only in small devices such as portable electronic devices but also in medium and large devices such as vehicles and energy storage systems (ESSs). When secondary batteries are used in such medium and large devices, a large number of secondary batteries are electrically connected to form a battery module or a battery pack in order to increase capacity and output power. In particular, pouch type battery cells are widely used in such medium and large devices because of advantages such as easy lamination and light weight. Pouch type battery cells have a structure in which an electrode assembly to which an electrode lead is connected is accommodated in a pouch case with an electrolyte solution and sealed. A part of the electrode lead is exposed outside the pouch case, and the exposed electrode lead is electrically connected to a device to which pouch type battery cells are mounted or is used to electrically connect pouch type battery cells to each other.

Meanwhile, lithium secondary batteries have a risk of explosion when overheated. In particular, as lithium secondary batteries are applied to electric vehicles including electric vehicles (EVs), hybrid electric vehicles (HEVs), plug-in hybrid electric vehicles (PHEVs), etc., in battery modules or battery packs that connect and use a large number of high capacity battery cells, a major accident may occur when an explosion occurs, and thus securing safety is one of main solutions. Conventionally, a positive temperature coefficient (PTC) device, a fuse, etc. have been proposed as a means of preventing explosion by blocking current when the temperature inside the secondary battery rises. However, they have a problem in that a separate mounting space is required in a battery module or a battery pack.

Currently, medium and large battery modules integrating pouch type battery cells are not mounted with a current interrupt device (CID) and safety enhancement mechanism. In the case of the CID mounted in the existing small cylindrical secondary battery, the safety of the cell is secured by the principle of disconnecting a certain part when the internal voltage of the cell rises and blocking a passage of current through the cell any more. However, there is a problem that the resistance is high to apply the CID to pouch type battery cells in medium and large battery modules. In the case of the CID applied to medium and large prismatic battery cells, the safety of the cell is secured by forcibly generating an external short when the internal voltage of the cell rises, melting the lead inside the cell, and blocking the passage of current. However, the CID of this principle has a problem that the CID operates even when the cell enters the end of life (EOL) period and thus the internal pressure of the cell rises. In addition, there is a problem that it is difficult to apply the CID to pouch type battery cells of medium and large battery modules due to the pouch deformation.

Securing safety is very important in that explosion of a battery module or a battery pack not only may cause damage to electronic devices or vehicles, etc., to which it is employed, but also may lead to the safety threat of users and ignition. If the secondary battery is overheated, the risk of explosion and/or ignition increases, and sudden combustion or explosion due to overheating may cause injury to people and property. Therefore, there is a demand for introducing means for sufficiently securing safety in use of secondary batteries.

DISCLOSURE

Technical Problem

The present disclosure is designed to solve the problems of the related art, and therefore the present disclosure is directed to solving a safety problem due to heat accumulation by improving heat dissipation, rather than applying a safety enhancement mechanism such as a CID or a PTC device in a medium and large battery module integrating a pouch type battery cell.

The present disclosure is directed to providing a battery module that improves heat dissipation by causing electronic cooling to occur at a specific voltage or higher, a battery pack including the battery module, and a vehicle including the battery pack.

Technical Solution

In one aspect of the present disclosure, there is provided a battery module including a plurality of battery cells, each battery cell having an electrode lead, a lead junction part in which respective leads of a first battery cell and a second battery cell of the plurality of battery cells are joined to each other, a thermoelectric device mounted onto the lead junction part; and a constant voltage device configured to bypass a current of the battery module to the thermoelectric device when an overvoltage of the battery module occurs, and the thermoelectric device may be driven to electronically cool the lead junction part of the battery module when the overvoltage of the battery module occurs.

The constant voltage device may be mounted onto the lead junction part.

The constant voltage device may be connected in parallel between a positive electrode lead of the first battery cell and a negative electrode lead of the second battery cell.

The constant voltage device may be a Zener diode or a varistor.

A breakdown voltage of the constant voltage device may be greater than a full charge voltage of the battery module.

The constant voltage device may be provided in a sensing circuit that senses a voltage state of the battery module, and a circuit capable of allowing the current of the battery module to flow toward the thermoelectric device when the breakdown voltage of the constant voltage device is reached may be provided between the constant voltage device and the thermoelectric device.

The lead junction part may include a flat portion welded by overlapping a bent portion formed by bending the electrode lead of the first battery cell at 90° and a bent portion formed by bending the electrode lead of the second battery cell at 90° in an opposite direction, and the thermoelectric device may be mounted onto the flat portion.

There may be a plurality of lead junction parts and the thermoelectric device may be mounted on each lead junction part of the plurality of lead junction parts.

The battery cells may be pouch type battery cells.

In another aspect of the present disclosure, there is provided a battery pack including at least one battery module according to the present disclosure; and a pack case configured to package the at least one battery module.

In another aspect of the present disclosure, there is provided a vehicle including at least one battery according to the present disclosure.

Advantageous Effects

The battery module according to the present disclosure further includes a constant voltage device and a thermoelectric device. By using the constant voltage device capable of allowing a current to flow in a desired direction at a specific voltage or higher, when overvoltage of the battery module occurs, the flow of the current is diverted to the thermoelectric device through the constant voltage device. By driving the thermoelectric device and electronically cooling the battery module using the diverted current, it is possible to prevent a phenomenon that the temperature of the battery module rapidly increases due to occurrence of overvoltage.

In the present disclosure, in particular, the thermoelectric device is mounted onto lead junction parts between battery cells. By doing in this way, instant cooling of the largest heating part is possible, and thus the heat dissipation effect is excellent. In addition, the constant voltage device and the thermoelectric device may be disposed at a short distance, and thus a structure of the battery module may be simplified.

According to the present disclosure, heat accumulation in the battery module may be prevented by sending the current to the thermoelectric device to cause an endothermic reaction when an overvoltage occurs and cooling battery cells. Therefore, overheating of the battery module may be prevented, and safety of the battery module is excellent.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
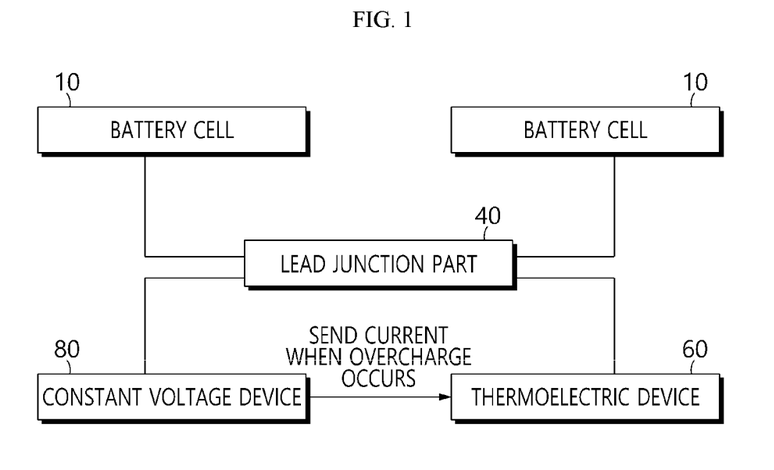
FIG. 1 is a block diagram illustrating a battery module according to an embodiment of the present disclosure.

FIG. 1 is a block diagram illustrating a battery module according to an embodiment of the present disclosure. Referring to FIG. 1, the battery module according to the present disclosure includes a plurality of battery cells 10, a thermoelectric device 60, and a constant voltage device 80. For the convenience of illustration, the minimum number of the battery cells 10 is shown.

A general battery module includes only the plurality of battery cells 10. The battery module according to the present disclosure further includes the thermoelectric device 60 and the constant voltage device 80.

As will be described in more detail below, the battery cells 10 have respective leads joined to each other to form lead junction parts 40, and the thermoelectric device 60 is mounted onto the lead junction part 40.

The constant voltage device 80 diverts the current of the battery module to the thermoelectric device 60 when overvoltage of the battery module occurs. The constant voltage device 80 is a device capable of allowing the current to flow in a desired direction at a specific voltage or higher. The constant voltage device 80 has a characteristic that allows the current to flow rapidly when a voltage equal to or greater than a breakdown voltage is applied between both terminals. That is, the constant voltage device 80 provided in the present disclosure is a device capable of diverting, i.e. diverting, the current at the breakdown voltage or higher, and means a device that blocks the current at a voltage lower than the breakdown voltage and allows the current to flow rapidly at a voltage higher than the breakdown voltage. Therefore, in the present disclosure, a necessary circuit may be configured using the constant voltage device 80 such that the current flows to the thermoelectric device 60 at the breakdown voltage of the constant voltage device 80 or higher. A specific value of the breakdown voltage may be appropriately adjusted by those skilled in the art as necessary. In the present disclosure, it is not necessary to use the constant voltage device 80 whose breakdown voltage is higher than needed. The maximum value of the breakdown voltage is different for each battery module.

The constant voltage device 80 may be applied to the battery module according to the present disclosure to divert the current during overvoltage to the thermoelectric device 60 and drive the thermoelectric device 60. By protecting the battery module from overheating or heat accumulation, the safety of the battery module may be improved.

The thermoelectric device 60 is driven by the diverted current. The thermoelectric device 60 is configured as a Peltier device capable of absorbing and generating heat by current supply. If a heat absorbing portion of the Peltier device is oriented toward the lead junction part 40 and a heat generating portion of the Peltier device is oriented toward the air, the thermoelectric device 60 may perform electronic cooling by current supply.

As is well known, the Peltier device includes the heat absorbing portion and the heat generating portion. In the present disclosure, the heat absorbing portion is in contact with the lead junction part 40 and the heat generating portion is exposed to the air. The Peltier effect refers to a phenomenon in which when any kind of metal is paired to flow the current, a contact of one side generates heat and a contact of the other side absorbs (cools) heat. The thermoelectric device 60 of the present disclosure is a device implementing such a Peltier effect, and generally connects n-type and p-type semiconductors formed of an alloy of Group V-VI and a solid solution thereof as cooling contacts through a copper plate at present. If the direction in which the current flows changes, heat absorbing and generating portions may be switched to each other, and the amount of heat absorption and generation may be adjusted according to the amount of current.

In the present disclosure, the current flow direction applied to the thermoelectric device 60 is considered such that the heat absorbing portion of the thermoelectric device 60 is in contact with the lead junction part 40 and the heat generating portion is exposed to the air. By mounting the thermoelectric device 60 onto the lead junction part 40 other than the inside of the battery cell 10 or another position within the battery module, the temperature increase of the battery module caused when the overvoltage of the battery module occurs may be effectively suppressed and an abnormal risk circumstance due to heat accumulation in the battery module may be prevented without affecting the volume of the battery module. In particular, because the lead junction part 40 forms a path through which the current directly flows, the lead junction part 40 is a large heat generating portion. In the present disclosure, the lead junction part 40 is preferentially cooled, and thus it is efficient in terms of heat dissipation of the battery module.

As described above, in the present disclosure, when the overvoltage occurs, the battery module is electronically cooled by driving the thermoelectric device 60 using the current of the battery module. As a result, a phenomenon in which the temperature of the battery module increases rapidly due to overvoltage may be prevented.

In the present disclosure, in particular, the thermoelectric device 60 is mounted onto the lead junction part 40 between the battery cells 10. In this way, instant cooling of the largest beating part is possible and thus, the heat dissipation effect is excellent. In addition, the constant voltage device 80 and the thermoelectric device 60 may be disposed at a short distance, and thus a structure of the battery module may be simplified.

Figure 2:
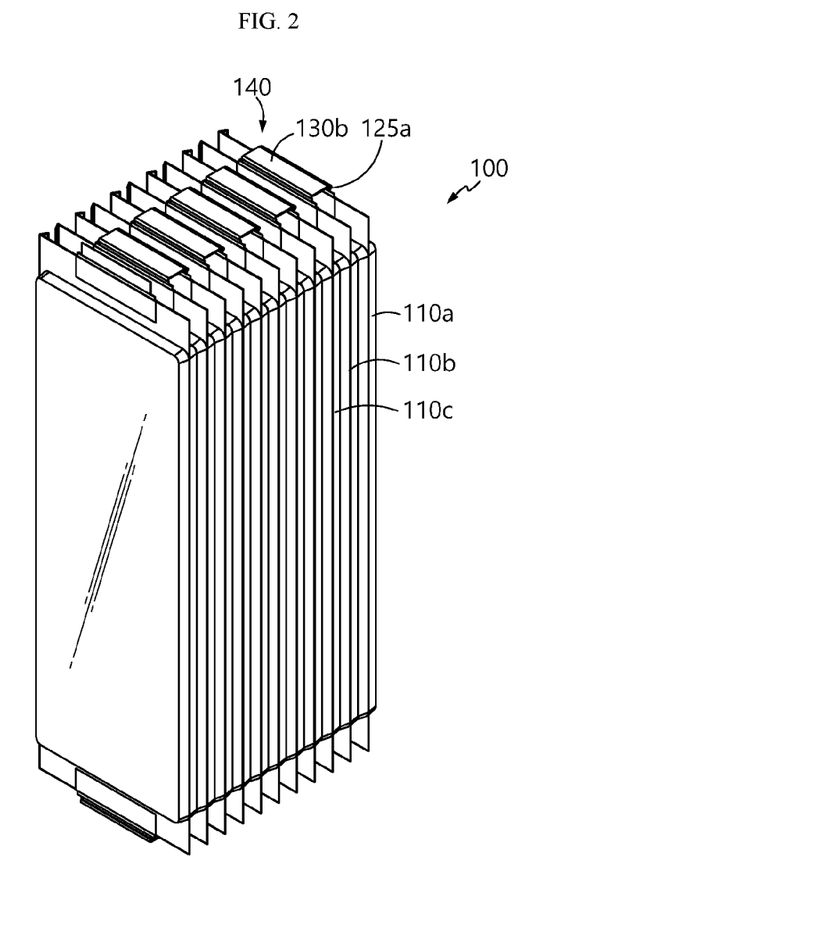
FIG. 2 is a perspective view schematically showing a battery module according to another embodiment of the present disclosure.
Figure 3:
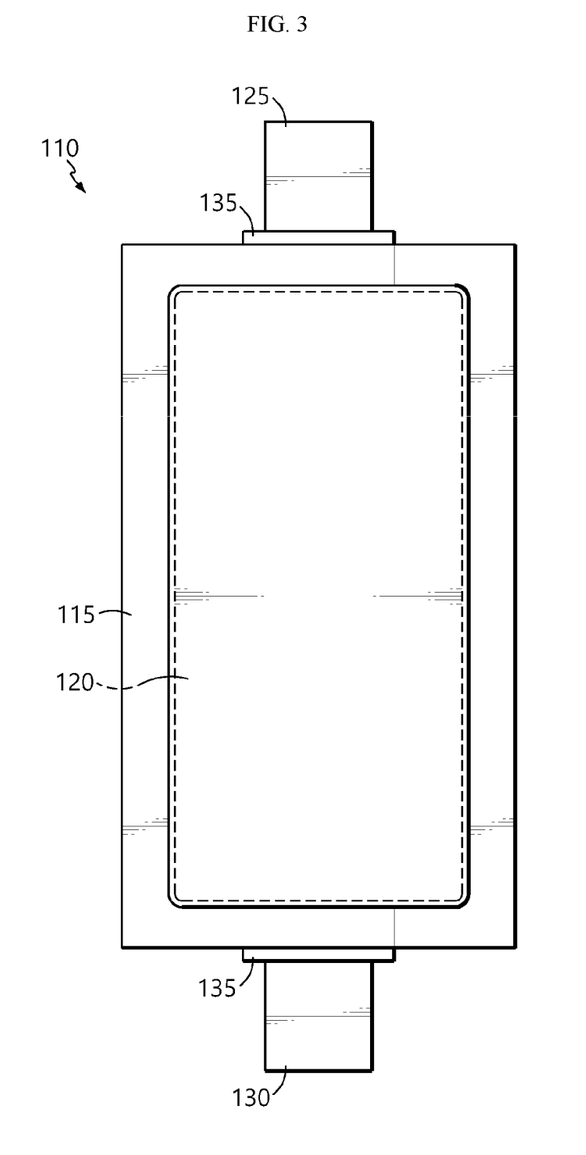
FIG. 3 is a top view of a pouch type battery cell as a unit battery cell included in the battery module of FIG. 2.

FIG. 2 is a perspective view schematically showing a battery module according to another embodiment of the present disclosure. FIG. 3 is a top view of a pouch type battery cell as a unit battery cell included in the battery module of FIG. 2.

The battery module 100 of FIG. 2 illustrates an example in which a plurality of battery cells 110a, 110b, 110c, etc. are electrically connected in series. Each of the plurality of battery cells 110a, 110b, 110c, etc. is a pouch type battery cell 110 as shown in FIG. 3 and may have the same structure.

Referring to FIG. 3, the pouch type battery cell 110 is accommodated and sealed in a pouch 115 together with the electrode assembly 120 and an electrolyte. The pouch 115 may include a metal layer, an outer resin layer, and an inner resin layer so as to seal the electrode assembly 120 and the electrolyte accommodated therein and protect the electrode assembly 120 and the electrolyte from the outside.

One end portion of each of plate shaped positive electrode lead 125 and negative electrode lead 130 is connected to both ends of the electrode assembly 120, and the other end portion thereof is exposed to the outside of the pouch 115. One end portion of the positive electrode lead 125 is electrically connected to a positive electrode plate of the electrode assembly 120, and one end portion of the negative electrode lead 130 is electrically connected to a negative electrode plate of the electrode assembly 120. The other end portions of the electrode leads 125 and 130 exposed to the outside of the pouch 115 are used to electrically connect a plurality of pouch type battery cells as shown in FIG. 2.

A lead film 135 is interposed between the pouch 115 and the electrode leads 125 and 130. The lead film 135 is provided to further improve the adhesiveness between the pouch 115 and the electrode leads 125 and 130. The lead film 135 may not only prevent a short circuit between the electrode leads 125 and 130 and the metal layer of the pouch 115 may but also improve the sealing property of the pouch 115. Thermal welding of the electrode leads 125 and 130 of a metal material and the pouch 115 of a polymer material may cause a somewhat large contact resistance, the surface adhesion may deteriorate. However, as in the above embodiment, when the lead film 135 is provided, such a phenomenon of deterioration of adhesion may be prevented. In addition, the lead film 135 may be an insulating material to preferably block the application of current from the electrode leads 125 and 130 to the pouch 115. The lead film 135 includes a film having insulation property and thermal welding property. The lead film 135 may include any one or more material layers (a single film or a multiple film) selected from, for example, polyimide (PI), polypropylene, polyethylene, polyethylene terephthalate (PET), etc.

The electrode assembly 120 assembles a unit cell having a structure in which a positive electrode plate and a negative electrode plate are disposed with a separator interposed therebetween. The unit cell may be simply stacked, stacked and folded, or manufactured into an electrode assembly in the form of a jelly roll. A method of manufacturing an electrode assembly in various types is widely known, and thus a detailed description thereof will be omitted. For example, the electrode assembly 120 may be formed by stacking a negative electrode plate, a separator, and a positive electrode plate. The electrode assembly 120 may be in the form of a monocell including negative electrode plate/separator/positive electrode plate or a bicell including negative electrode plate/separator/positive electrode plate/separator/negative electrode plate or positive electrode plate/separator/negative electrode plate/separator/positive electrode plate. In the present embodiment, an example of a bidirectional battery in the form in which the positive electrode lead 125 and the negative electrode lead 130 are drawn from the pouch 115 in opposite directions is given, but a unidirectional cell in the form in which both the positive electrode lead 125 and the negative electrode lead 130 are drawn from the pouch 115 in one direction is not excluded.

Referring to FIGS. 2 and 3 together, the battery cells 110a and 110b are stacked such that the electrode leads protrude from both ends thereof, and the electrode leads have opposite polarities, for example, the positive electrode lead 125a of the battery cell 110a is placed side by side with the negative electrode lead 130b of the battery cell 110b. That is, several battery cells are stacked alternately such that electrode leads placed side by side have opposite polarities. There may be various ways in which the battery cells 110a, 110b, 110c, etc. are connected in series. In FIG. 2, a configuration in which the other end portions of the electrode leads 125a and 130b are folded and bent in a left or right side to provide a flat contact surface and then overlap to each other and are connected through welding is illustrated.

In FIG. 2, a total number of 1 battery cells are included. The electrode leads of each battery cell are vertically bent such that the electrode leads of the neighboring battery cells and the vertically bent portions overlap each other to form the lead junction part 140. More specifically, in one side of the stacked battery cells 110a, 110b, 110c, etc. the inside electrode leads except for the electrode leads positioned outside are bent to overlap each other, and then bent electrode lead portions are electrically connected. On the other side of the stacked battery cells 110a, 110b, 110c, etc. all the electrode leads are bent to overlap each other and then welded and bent electrode lead portions are electrically connected.

In FIG. 2, the battery cells 110a, 110b, 110c, etc. are stacked upright in a vertical direction. When the electrode leads are bent, in the battery cells, the electrode lead of any one side is vertically bent in the right direction (or the outside of the battery module), and the electrode lead of the other side is vertically bent in the left direction (or the inside of the battery module). Accordingly, the lead junction part 140 to be coupled is "r" shaped such that the electrode leads of different polarities are bent and overlapped. And, the lead junction parts 140 are arranged side by side along a horizontal direction. This process may be performed in the reverse process, for example, the electrode leads may be first bent, the battery cells are stack in a state where the electrodes leads are bent, and then the corresponding parts may be welded.

Meanwhile, although FIG. 2 illustrates a method of overlapping and directly connecting the electrode leads, an indirect connection method using a bus bar is also possible. For example, it is apparent that the present disclosure may be applied to a case in which a battery module is configured by welding a bus bar together with an electrode lead or a battery module is configured by welding an electrode lead and an external circuit.

Figure 4:
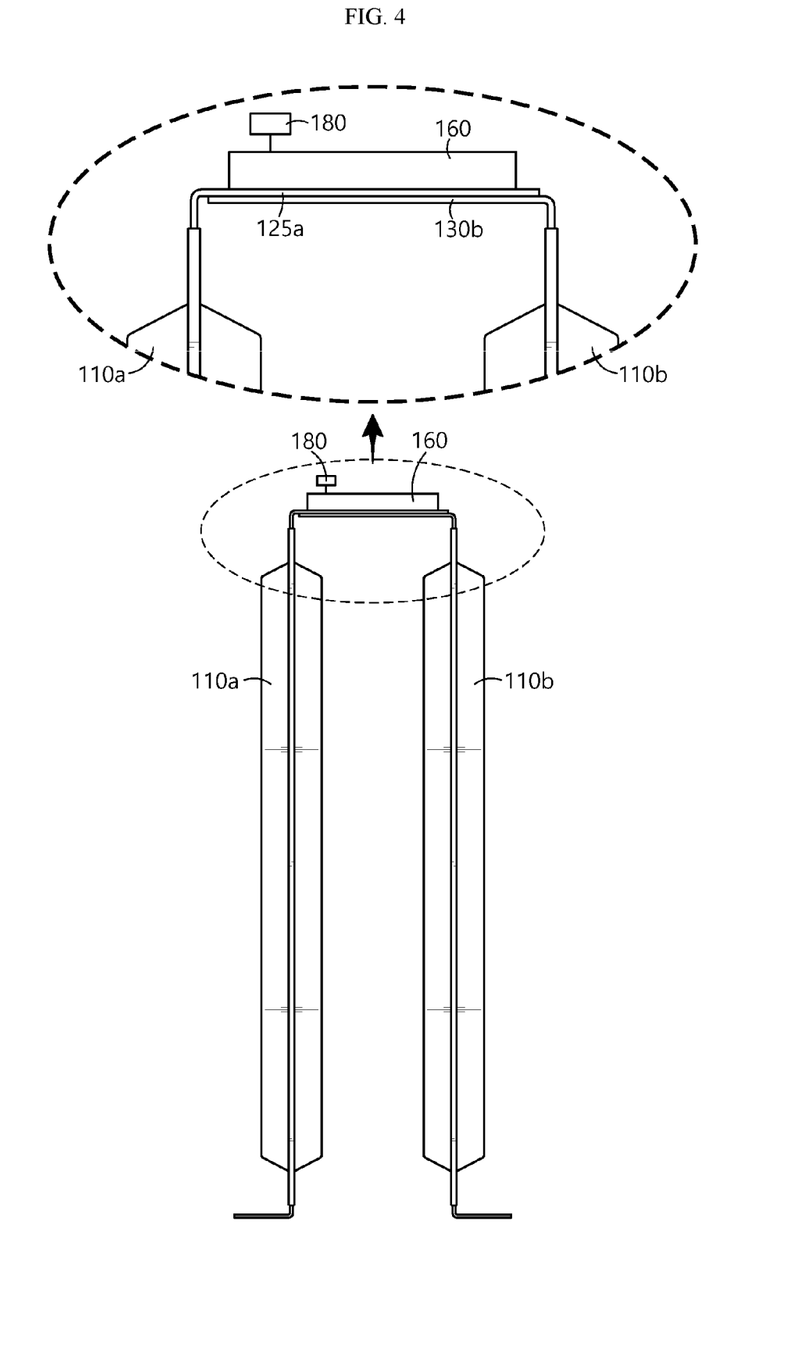
FIG. 4 schematically illustrates lead junction parts between two adjacent battery cells in the battery module of FIG. 2.

FIG. 4 schematically illustrates lead junction pans between two adjacent battery cells in a battery module of FIG. 2.

Referring to FIG. 2 and FIG. 4 together, when two adjacent battery cells in the battery module 100 are referred to as the first battery cell 110a and the second battery cell 110b, the positive electrode lead 125a of the first battery cell 110a and the negative electrode lead 130b of the second battery cell 110b are connected. In this way, the first and second battery cells 110a and 110b are electrically connected in electrical series. The connection may be performed by using a method generally used in the art, for example, the battery cells may be coupled and connected by ultrasonic welding, but the present disclosure is not limited thereto.

In the present embodiment, the other end portion of the positive electrode lead 125a of the first battery cell 110a and the other end portion of the negative electrode lead 130b of the second battery cell 110b are bent toward each other along the stack direction of the first and second battery cells 110a and 110b, and the lead junction part 140 is formed to include a flat portion in which bent portions bent and provided in the electrode leads 125a and 130b are overlapped and welded. A thermoelectric device 160 is mounted onto the flat portion. And, preferably, a constant voltage device 180 is also mounted onto the lead junction part 140. Like the thermoelectric device 160, the constant voltage device 180 may be mounted onto the flat portion of the lead junction part 140, or may be mounted onto a portion other than the flat portion. Although the constant voltage device 180 may be provided at a position other than the lead junction part 140, in the way that the constant voltage device 180 and the thermoelectric device 160 are disposed at a short distance to simplify the structure of the battery module 100, it is preferable to mount the constant voltage device 180 onto the lead junction part 140.

Meanwhile, although FIG. 4 illustrates an example in which the thermoelectric device 160 is mounted onto the flat portion (that is, the upper side of the flat portion in the drawing) facing the outside of the battery module 100 in the lead junction part 140, the thermoelectric device 160 may be mounted onto the flat portion (that is, the lower side of the flat portion in the drawing) facing the opposite side, i.e., the inside of the battery module 100. The mounting position of the thermoelectric device 160 may be determined in consideration of the convenience of a mounting operation, the utilization of a space as the entire battery module, etc.

Figure 5:
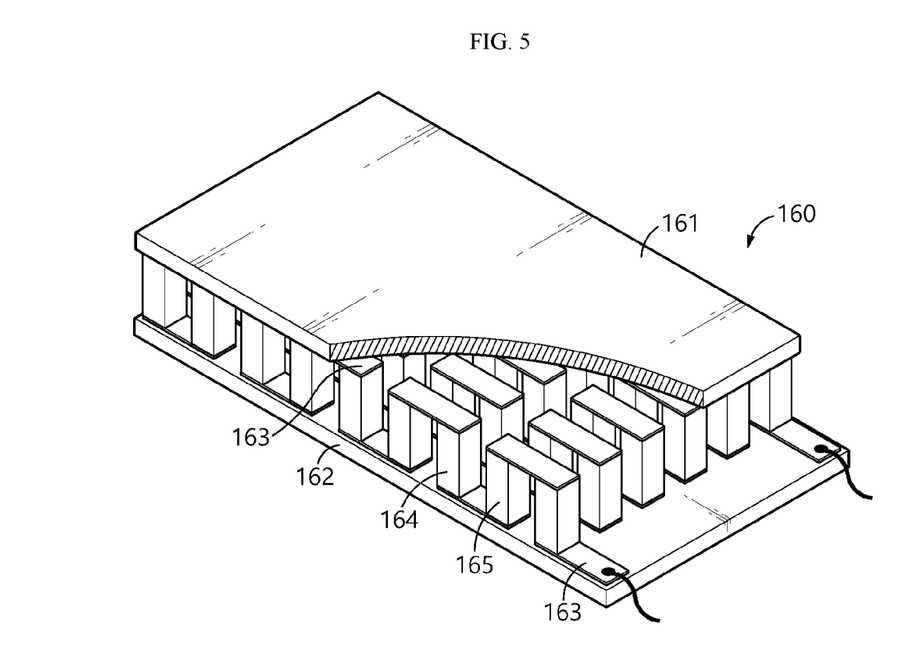
FIG. 5 is a partially cut perspective view illustrating a thermoelectric device included in a battery module according to the present disclosure.
Figure 6:
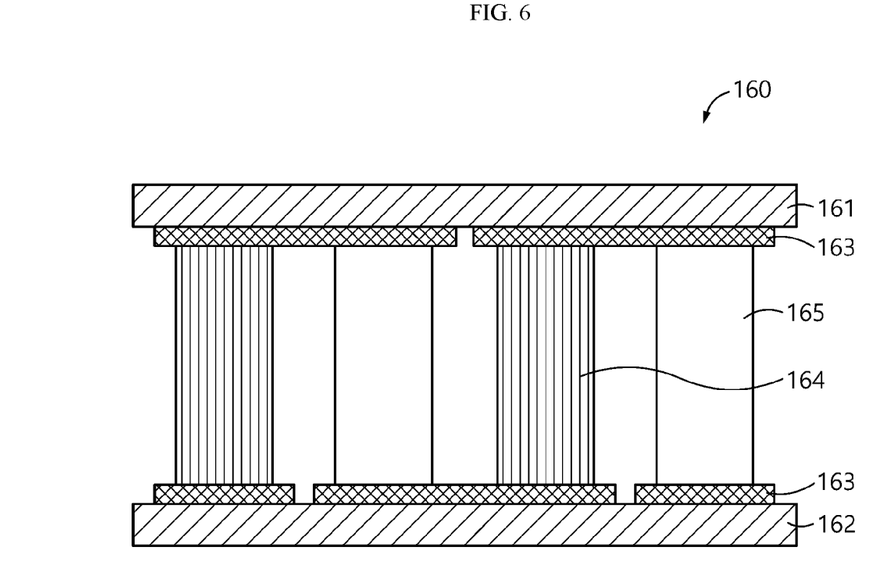
FIG. 6 is a front view of the thermoelectric device shown in FIG. 5.

FIG. 5 is a partially cut perspective view illustrating a thermoelectric device included in a battery module according to the present disclosure. FIG. 6 is a front view of the thermoelectric device shown in FIG. 5. FIGS. 5 and 6 show a thermoelectric module as an example of the thermoelectric device. Since the thermoelectric module may be manufactured in a plate shape, the thermoelectric module may be easily mounted onto a flat portion of the lead junction part 140.

Referring to FIGS. 5 and 6, the thermoelectric device 160 may include an upper substrate 161 and a lower substrate 162, metal electrodes 163 disposed on one surface of the upper substrate 161 and the lower substrate 162, and a plurality of p-type thermoelectric semiconductors 164 and n-type thermoelectric semiconductors 165 spaced between the metal electrodes 163. The metal electrode 163 allows the current to flow through the p-type thermoelectric semiconductor 164 and the n-type thermoelectric semiconductor 165 when power is applied to the thermoelectric device 160, and more specifically, may include an upper metal electrode provided on the lower surface of the upper substrate 161 and a lower metal electrode provided on the upper surface of the lower substrate 162. The metal electrode 163 may be formed of a material having high electrical conductivity in order to minimize the loss of current supplied to the thermoelectric device 160, and more specifically, may be formed of a material having excellent conductivity such as silver or copper.

The p-type thermoelectric semiconductor 164 and the n-type thermoelectric semiconductor 165 may be spaced apart from each other one by one on one surface of the upper metal electrode and the lower metal electrode. In more detail, the p-type thermoelectric semiconductor 164 may be provided on the left side of the lower surface of the upper electrode, and the n-type thermoelectric semiconductor 165 may be provided spaced to the right side from the p-type thermoelectric semiconductor 164. The n-type thermoelectric semiconductor 165 may be provided on the left side of the upper surface of the lower electrode, and the p-type thermoelectric semiconductor 164 may be provided spaced to the right side from the n-type thermoelectric semiconductor 165.

When the current is applied to the thermoelectric device 160, the p-type thermoelectric semiconductor 164 and the n-type thermoelectric semiconductor 165 are electrically connected in series, and the current flows. Due to the Peltier effect, holes in the p-type thermoelectric semiconductor 164 move with heat toward the (−) side, and electrons in the n-type thermoelectric semiconductor 165 move with heat toward the (+) side, and thus the upper substrate 161 is heated, and the lower substrate 162 is cooled.

Therefore, the lower substrate 162 of the thermoelectric device 160 used in the present disclosure may operate as a heat absorbing portion of the lead junction part 140 in the battery module 100 according to the present disclosure, the upper substrate 161 may operate as a heat generating portion, and accordingly, it is preferable that the lower substrate 162 is configured to be in thermal contact with the flat portion of the lead junction part 140.

A plurality of lead junction parts 140 may be formed in one battery module 100. The thermoelectric device 160 may be mounted for each lead junction part 140 or may be mounted only onto anyone of the plurality of lead junction parts 140. The battery module 100 is preferably mounted onto each lead junction part 140 in view of overall cooling.

As such, in the battery module 10, because the thermoelectric device 160 is in thermal contact with the lead junction part 140 in correspondence with the plurality of battery cells 110*a*, 110*b*, etc. the overall size of the battery module 100 does not increase, the battery module 100 has no additional parts, and the manufacturing process of the battery module 100 is not complicated. In addition, since cooling is collectively performed on the lead junction part 140, a temperature deviation is not caused. Since the structure of the thermoelectric device 160 is simple and has no additional accessory device, a very compact battery module 100 may be manufactured. Therefore, an available space of the entire system, such as the battery module 100 and a battery pack including the battery module 100, etc. is secured.

The constant voltage device 180 is an element that drives the thermoelectric device 160 by diverting the current of the battery module 100 to the thermoelectric device 160 when the overvoltage of the battery module 100 occurs to enable cooling, called electronic cooling, of the lead junction part 140 as described above. The constant voltage device 180 is a device capable of allowing a current to flow in a desired direction at a breakdown voltage or higher, and preferably includes a Zener diode or a varistor.

The Zener diode is a device using the Zener effect. The Zener effect is a phenomenon that when a high voltage is applied to a semiconductor or the like, because the energy at the upper end of a valence band is the same as the energy at the lower end of a conduction band in a very close part, the tunnel effect increases the probability of electrons moving from the valence band to the conduction band, resulting in flowing a current. In other words, the Zener effect is a phenomenon of increase in the current that appears when the probability that a valence moves to the conduction band by the tunnel effect increases due to any strong electric field generated in the semiconductor. The Zener diode using these characteristics may be manufactured in a semiconductor p-n junction and is well known as a device having a characteristic that when a relatively large voltage in a reverse direction is applied, a large current starts to flow rapidly at a certain voltage and the voltage remains constant.

The varistor is a nonlinear semiconductor resistance device whose resistance value changes according to voltages applied to both ends of the varistor and which is an abbreviation of a variable resistor. Kinds of varistors include symmetric varistors whose resistance is determined only by the magnitude of the voltage regardless of the polarity of the applied voltage, and asymmetric varistors whose resistance varies depending on the polarity of the applied voltage.

Those skilled in the art may configure a necessary circuit by using the constant voltage device 180 such that the current flows to the thermoelectric device 160 at the breakdown voltage of the constant voltage device 180 or higher. When the circuit is configured as described above, the thermoelectric device 160 may be driven in an overvoltage circumstance of the battery module 100 to prevent heat accumulation in the battery module 100.

The breakdown voltage of the constant voltage device 180 is greater than the full charge voltage of the battery module 100. For example, if the full charge voltage is 4.3V, the breakdown voltage may be set to 4.73V which is 10% greater than 4.3V, or 4.945V which is 15% greater than 4.3V, or 5.16V which is 20% greater than 4.3V, to select the constant voltage device 180 corresponding thereto and achieve a circuit configuration. The constant voltage device 180 may be used by obtaining a commercially available one. Constant voltage devices having various breakdown voltages are commercially available, and thus those skilled in the art may purchase and use appropriate constant voltage devices as necessary.

Preferably, the constant voltage device 180 may be provided in a sensing circuit that senses a voltage state of the battery module 100. The normal battery module 100 has a sensing circuit that senses the voltage state and a control circuit that controls charging and discharging of the battery module 100 using the sensed voltage state. In the present disclosure, the battery module 100 may be implemented by further including the constant voltage device 180 in the sensing circuit.

In addition, a circuit must be provided between the constant voltage device 180 and the thermoelectric device 160 to allow the current of the battery module 100 to flow toward the thermoelectric device 160 when the breakdown voltage of the constant voltage device 180 is reached. Various circuits for providing a current flow path may be easily implemented by those skilled in the art, and thus detailed descriptions thereof will be omitted.

Preferably, the constant voltage device 180 may connect in parallel the positive electrode lead 125a of any one battery cell, for example, the first battery cell 110a and the negative electrode lead 130b of the other one battery cell, for example, the second battery cell 110b among the lead junction parts 140.

As described above, in the present disclosure, when the overvoltage occurs, the thermoelectric device 160 is driven by using the current of the battery module 100 to electronically cool the battery module 100. As a result, a phenomenon in which the temperature of the battery module 100 increases rapidly due to overvoltage may be prevented.

In the present disclosure, in particular, the thermoelectric device 160 is mounted onto the lead junction part 140 between the battery cells 110. In this way, instant cooling of the largest heating part is possible and the beat dissipation effect is excellent. In addition, since the constant voltage device 180 and the thermoelectric device 160 may be disposed at a short distance, a structure of the battery module may be simplified.

Since the battery module according to the present disclosure has no heat accumulation and has excellent safety, the battery module is also suitable for use as a power source for a medium and large device requiring high temperature stability, long cycle characteristics, high rate characteristics, etc. Preferred examples of the medium and large device include a power tool that is driven by an electric motor; electric vehicles including EV, HEV, PHEV, and the like; electric motorcycles including e-bikes and e-scooters; electric golf carts; and ESS, but are not limited thereto.

A normal battery module includes a protection circuit to prevent overcharging. The protection circuit interrupts a charge current or a discharge current by blocking a charge/discharge circuit when a voltage (that is, an overcharge circumstance) equal to or higher than a chargeable voltage or a voltage (that is, the overdischarge circumstance) equal to or lower than a dischargeable voltage is detected. In general, although secondary batteries include the battery protection circuit to prevent damage of the secondary battery due to overcharging or overdischarging, because most of secondary batteries include a protection circuit IC or configure a separate complicated overcharge prevention circuit, there is an undesirable problem in terms of cost and efficiency. And when the battery protection circuit does not operate normally, especially when the control of overcharge prevention does not function normally, it is difficult to ensure the safety of the battery module. In addition, the safety is very weak when the battery module does not operate properly due to the malfunction of the protection circuit. The battery module of the present disclosure may greatly improve the heat dissipation characteristics during overvoltage of the battery module regardless of whether the protection circuit is provided, which is a great help in securing safety. In addition, since the constant voltage device of the present disclosure is additionally inserted into the sensing circuit of the existing battery module and constitutes a new circuit, the constant voltage device is easy to utilize. Recently, since the characteristics of an electrolyte and a separator or an electrode structure included in the secondary battery are improved, and predetermined means for preventing overcharging is provided in the electrolyte and the electrode assembly itself, attempts to configure secondary batteries using only bare cells without a protection circuit in terms of the manufacturing cost are increasing. In the present disclosure, a bare cell-based battery module without a protection circuit may be sufficiently utilized as a basic and minimal safety device because the battery module may prevent occurrence of a problem such as heat accumulation during overvoltage with minimal components such as a thermoelectric device and a constant voltage device.

Figure 7:
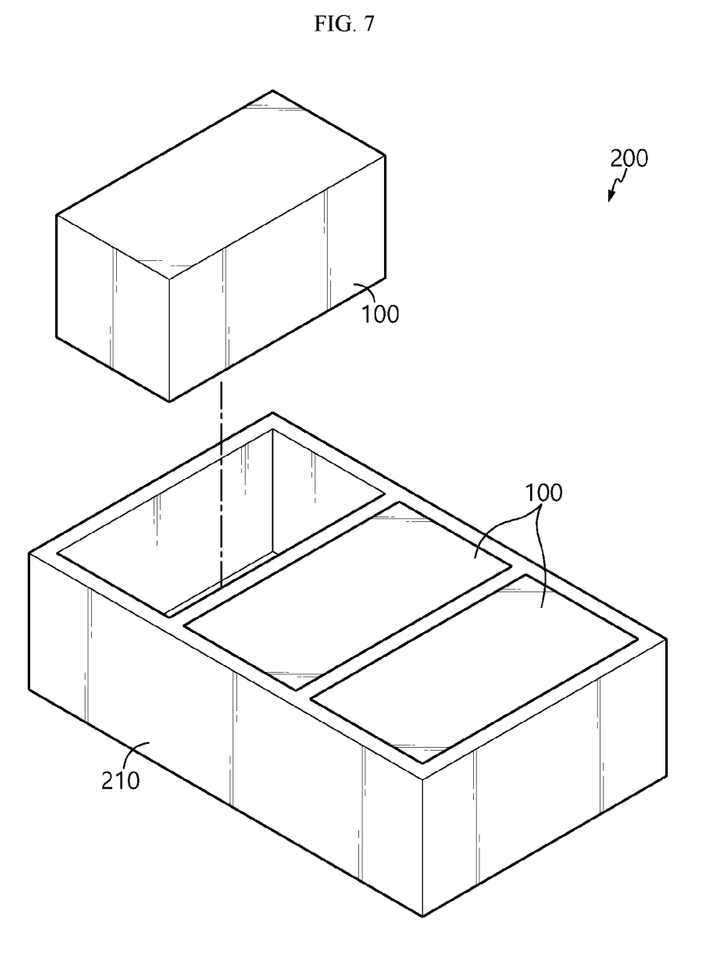
FIG. 7 is a diagram illustrating a battery pack according to another embodiment of the present disclosure.
Figure 8:
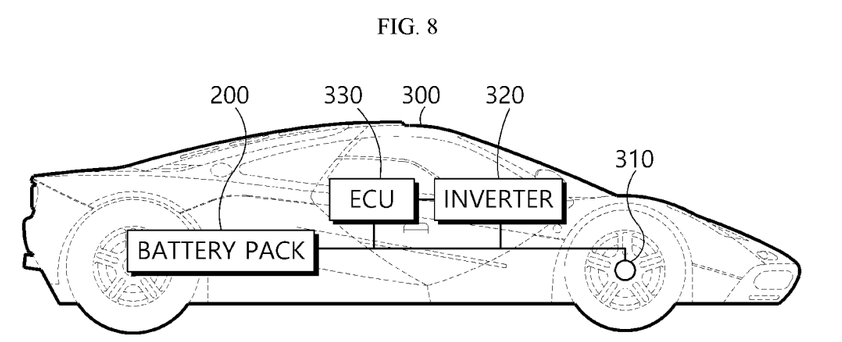
FIG. 8 is a diagram illustrating a vehicle according to another embodiment of the present disclosure.

FIG. 7 is a diagram illustrating a battery pack according to an embodiment of the present disclosure. FIG. 8 is a diagram illustrating a vehicle according to an embodiment of the present disclosure.

Referring to FIGS. 7 and 8, a battery pack 200 may include at least one battery module according to the foregoing embodiment, for example, the battery module 100 of the second embodiment and a pack case 210 for packaging the battery pack 200. In addition, the battery pack 200 according to the present disclosure, in addition to the battery module 100 and the pack case 210, may further include various devices for controlling charging and discharging of the battery module 100, such as a battery management system (BMS), a current sensor, a fuse, etc.

The battery pack 200 may be provided in a vehicle 300 as a fuel source of the vehicle 300. For example, the battery pack 200 may be provided in the vehicle 300 in other ways that may utilize electric vehicles, hybrid vehicles, and the other battery pack 200 as fuel sources.

Preferably, the vehicle 300 may be an electric vehicle. The battery pack 200 may be used as an electric energy source that drives the vehicle 300 by providing a driving force to a motor 310 of the electric vehicle. In this case, the battery pack 200 has a high nominal voltage of 100V or higher. Ina hybrid vehicle, the battery pack 200 is set to 270V.

The battery pack 200 may be charged or discharged by an inverter 320 according to the driving of the motor 310 and/or an internal combustion engine. The battery pack 200 may be charged by a regenerative charging device coupled with a break. The battery pack 200 may be electrically connected to the motor 310 of the vehicle 300 through the inverter 320.

As described above, the battery pack 200 also includes the BMS. The BMS estimates the state of battery cells in the battery pack 200 and manages the battery pack 200 using estimated state information. For example, the BMS estimates and manages state information of the battery pack 200 such as state of charge (SOC) of the battery pack 200, state of health (SOH), maximum input/output power allowance, output voltage, etc. In addition, the BMS may use the state information to control the charging or discharging of the battery pack 200, and further, estimate the replacement time of the battery pack 200.

An ECU 330 is an electronic control device for controlling the state of the vehicle 300. For example, the ECU 330 determines torque information based on information such as an accelerator, a brake, a speed, etc., and controls the output of the motor 310 to match the torque information. In addition, the ECU 330 transmits a control signal to the inverter 320 such that the battery pack 200 may be charged or discharged based on the state information such as SOC and SOH of the battery pack 200 received by the BMS. The inverter 320 causes the battery pack 200 to be charged or discharged based on the control signal of the ECU 330. The motor 310 drives the vehicle 300 based on control information (e.g., torque information) transmitted from the ECU 330 using electric energy of the battery pack 200.

The vehicle 300 includes the battery pack 200 according to the present disclosure. The battery pack 200 includes the battery module 100 with improved safety as described above. Therefore, the stability of the battery pack 200 is improved, the battery pack 200 is excellent in stability and may be used for a long time, and thus the vehicle 300 including the battery pack 200 is safe and easy to operate.

In addition, the battery pack 200 may also be provided in other devices, equipment, and facilities, such as an ESS using a secondary battery, in addition to the vehicle 30).

As such, the battery pack 200 according to the present embodiment and devices or equipment and facilities including the battery pack 200, such as the vehicle 300, include the battery module 100 described above, and thus the battery pack 200 having all the advantages owing to the battery module 100 described above and devices or equipment and facilities such as the vehicle 300 including the battery pack 2 may be implemented.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. A battery module, comprising:
   a plurality of battery cells, each battery cell having an electrode lead;
   a lead junction part in which respective electrode leads of a first battery cell and a second battery cell of the plurality of battery cells are joined to each other;
   a thermoelectric device mounted onto the lead junction part; and
   a constant voltage device configured to bypass a current of the battery module to the thermoelectric device when an overvoltage of the battery module occurs,
   wherein the thermoelectric device is driven to electronically cool the lead junction part of the battery module when the overvoltage of the battery module occurs, and
   wherein the constant voltage device is a Zener diode or a varistor.

2. The battery module of claim 1, wherein the constant voltage device is mounted onto the lead junction part.

3. The battery module of claim 2, wherein the constant voltage device is connected in parallel between a positive electrode lead of the first battery cell and a negative electrode lead of the second battery cell.

4. A battery module, comprising:
   a plurality of battery cells, each battery cell having an electrode lead;
   a lead junction part in which respective electrode leads of a first battery cell and a second battery cell of the plurality of battery cells are joined to each other;
   a thermoelectric device mounted onto the lead junction part; and
   a constant voltage device configured to bypass a current of the battery module to the thermoelectric device when an overvoltage of the battery module occurs,
   wherein the thermoelectric device is driven to electronically cool the lead junction part of the battery module when the overvoltage of the battery module occurs, and
   wherein a breakdown voltage of the constant voltage device is greater than a full charge voltage of the battery module.

5. A battery module, comprising:
   a plurality of battery cells, each battery cell having an electrode lead;
   a lead junction part in which respective electrode leads of a first battery cell and a second battery cell of the plurality of battery cells are joined to each other;
   a thermoelectric device mounted onto the lead junction part; and
   a constant voltage device configured to bypass a current of the battery module to the thermoelectric device when an overvoltage of the battery module occurs,
   wherein the thermoelectric device is driven to electronically cool the lead junction part of the battery module when the overvoltage of the battery module occurs,
   wherein the constant voltage device is provided in a sensing circuit that senses a voltage state of the battery module, and
   wherein a circuit capable of allowing the current of the battery module to flow toward the thermoelectric device when a breakdown voltage of the constant voltage device is reached is provided between the constant voltage device and the thermoelectric device.

6. The battery module of claim 1, wherein the lead junction part comprises a flat portion welded by overlapping a bent portion formed by bending the electrode lead of the first battery cell at 90° and a bent portion formed by bending the electrode lead of the second battery cell at 90° in an opposite direction, and
   wherein the thermoelectric device is mounted onto the flat portion.

7. The battery module of claim 1, further comprising a plurality of lead junction parts,
   wherein the thermoelectric device is mounted on each lead junction part of the plurality of lead junction parts.

8. The battery module of claim 1, wherein the battery cells are pouch battery cells.

9. A battery pack comprising:
   at least one battery module according to claim 1; and
   a pack case configured to package the at least one battery module.

10. A vehicle comprising at least one battery pack according to claim 9.

* * * * *